United States Patent
Presman et al.

(10) Patent No.: US 9,152,488 B2
(45) Date of Patent: Oct. 6, 2015

(54) STORAGE MODULE AND LOW-COMPLEXITY METHODS FOR ASSESSING THE HEALTH OF A FLASH MEMORY DEVICE

(71) Applicants: Noam Presman, Givatayim (IL); Idan Alrod, Herzliya (IL); Eran Sharon, Rishon Lezion (IL)

(72) Inventors: Noam Presman, Givatayim (IL); Idan Alrod, Herzliya (IL); Eran Sharon, Rishon Lezion (IL)

(73) Assignee: SanDisk Technologies Inc., Plano, TX (US)

( * ) Notice: Subject to any disclaimer, the term of this patent is extended or adjusted under 35 U.S.C. 154(b) by 178 days.

(21) Appl. No.: 13/926,709

(22) Filed: Jun. 25, 2013

(65) Prior Publication Data
US 2014/0380106 A1    Dec. 25, 2014

(51) Int. Cl.
*G11C 29/00* (2006.01)
*G06F 11/07* (2006.01)
*G06F 11/10* (2006.01)
*G06F 11/34* (2006.01)

(52) U.S. Cl.
CPC .......... *G06F 11/073* (2013.01); *G06F 11/1012* (2013.01); *G06F 11/3452* (2013.01)

(58) Field of Classification Search
CPC  G06F 11/073; G06F 11/1012; G06F 11/3452
See application file for complete search history.

(56) References Cited

U.S. PATENT DOCUMENTS

| | | | |
|---|---|---|---|
| 2003/0037299 A1* | 2/2003 | Smith | 714/763 |
| 2003/0056160 A1* | 3/2003 | Kohnen et al. | 714/718 |
| 2006/0248411 A1 | 11/2006 | Kirscht | |
| 2009/0046512 A1* | 2/2009 | Halloush et al. | 365/185.09 |
| 2009/0129186 A1 | 5/2009 | Schnell et al. | |
| 2009/0199056 A1 | 8/2009 | Murata | |
| 2010/0165692 A1* | 7/2010 | Jeddeloh | 365/51 |
| 2012/0060054 A1 | 3/2012 | Sun et al. | |
| 2012/0226963 A1* | 9/2012 | Bivens et al. | 714/773 |
| 2013/0013977 A1* | 1/2013 | Rivers et al. | 714/763 |
| 2013/0205174 A1* | 8/2013 | Zorn et al. | 714/48 |
| 2014/0136927 A1* | 5/2014 | Li et al. | 714/768 |

* cited by examiner

*Primary Examiner* — M. Mujtaba K Chaudry
(74) *Attorney, Agent, or Firm* — Brinks Gilson & Lione

(57) ABSTRACT

A storage module and low-complexity methods for assessing the health of a flash memory device are disclosed. In one embodiment, data is written to a subset of memory cells in a memory of a storage module. Error statistics for the subset of memory cells are determined, and cell error rate parameters for the memory are estimated by fitting the determined error statistics for the subset of memory cells with a parametric statistical model. Other embodiments are possible, and each of the embodiments can be used alone or together in combination.

15 Claims, 7 Drawing Sheets

STORAGE MODULE AND LOW-COMPLEXITY METHODS FOR ASSESSING THE HEALTH OF A FLASH MEMORY DEVICE

BACKGROUND

Because defects may occur when manufacturing a flash memory device, it is often preferred to test the memory during production in order to determine if the memory is "healthy" enough for its intended operation. Previous approaches for estimating a flash memory's health are implemented in the fabrication facility as part of the testing (qual) phase and are not performed during the memory's lifetime due to complexity of the testing procedure. Specifically, during the health test, reference data is written to multiple e-blocks (i.e., an error correction code (ECC) codeword) in the flash memory. The e-blocks are then read from memory, the data is decoded, and the error statistics are gathered from all of the data. Using the error statistics data, the "health" condition of the memory is estimated, and the memory is qualified or disqualified accordingly. These previous approaches for evaluating memory health involve storing large amounts of data, so health analysis is limited to production and testing times and could not be performed during normal operation of the memory device during its routine operation.

OVERVIEW

Embodiments of the present invention are defined by the claims, and nothing in this section should be taken as a limitation on those claims.

By way of introduction, the below embodiments relate to a storage module and low-complexity methods for assessing the health of a flash memory device. In one embodiment, data is written to a subset of memory cells in a memory of a storage module. Error statistics for the subset of memory cells are determined, and cell error rate parameters for the memory are estimated by fitting the determined error statistics for the subset of memory cells with a parametric statistical model. Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

Introduction

The following embodiments can be used to solve the problem of estimating a flash memory's expected error rate using low complexity methods. These embodiments can be implemented in the fab during manufacturing, thereby reducing the cost of currently-employed methods and significantly shortening testing time. Moreover, these embodiments can be implemented in a flash memory storage module during its normal operation period and provide a reliable estimate on the condition of the memory. This estimate may be compared to standard criteria of health, such as, for example, (1) qualitative data measurements for the current lifetime point and (2) minimum allowed failure rate requirements. Using this comparison, it will be possible to decide if the memory die is healthy or not and also provide a health grade. For example, in an enterprise multi-die system the health grade may be used to limit the work load on a "sick" die or disable it all together. The user or the system administrator can be notified of this problem, so he may take a preventive action before a catastrophic event occurs (for example, if the disk is part of a RAID (Redundancy Array of Inexpensive Disks) system, the administrator may choose to replace the disk before a disk failure occurs). Alternatively, the current lifetime point of a die may be estimated by the health grade, and the operational parameters of the die (e.g. number of parity bits in encoding, number of bits used to represent the soft data in decoding etc.) may be adjusted accordingly.

Before turning to these and other embodiments, the following section provides a discussion of an exemplary storage module that can be used with these embodiments. Of course, these are just examples, and other suitable types of storage modules can be used.

Exemplary Storage Module

Figure 1:
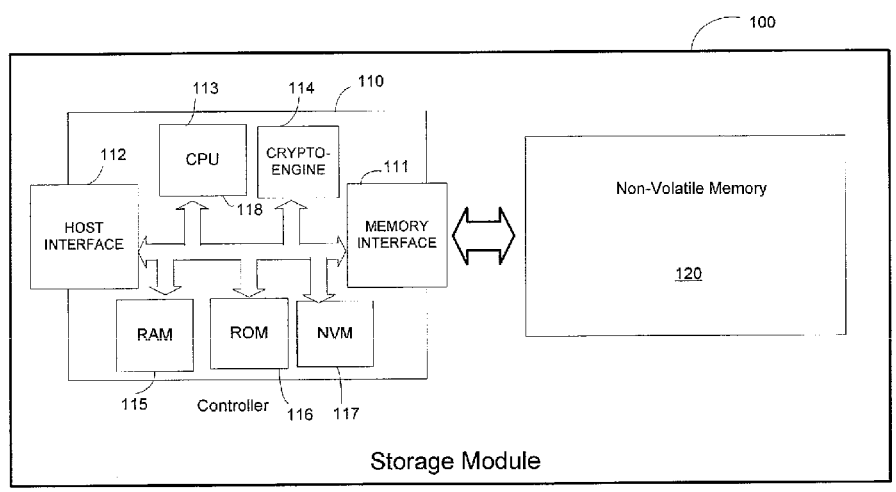
FIG. 1 is a block diagram of an exemplary storage module of an embodiment.

As illustrated in FIG. 1, a storage module 100 of one embodiment comprises a controller 110 and non-volatile memory 120. The controller 110 comprises a memory interface 111 for interfacing with the non-volatile memory 120 and a host interface 112 for placing the storage module 100 operatively in communication with a host. As used herein, the phrase "operatively in communication with" could mean directly in communication with or indirectly in communication with through one or more components, which may or may not be shown or described herein.

Figure 2A:
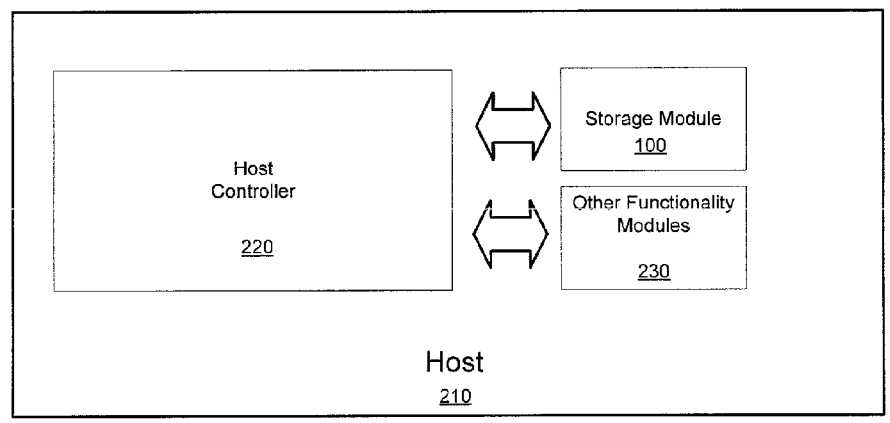
FIG. 2A is a block diagram of a host of an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation. The host controller 220 can interface with the embedded storage module 100 using, for example, an eMMC host interface or a UFS interface. The host 210 can take any form, such as, but not limited to, a solid state drive (SSD), a hybrid storage device (having both a hard disk drive and a solid state drive), a memory caching system, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing.

Figure 2B:
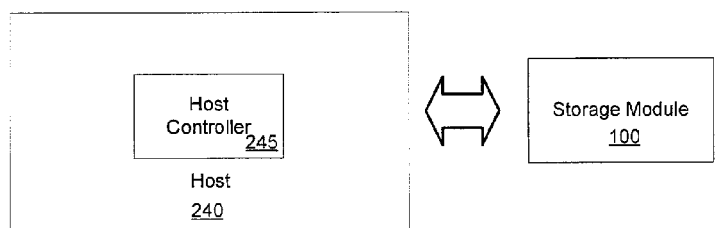
FIG. 2B is a block diagram of the exemplary storage module of FIG. 1 removably connected to a host, where the storage module and host are separable, removable devices.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a removable memory device, such as a Secure Digital (SD) memory card, a microSD memory card, a Compact Flash (CF) memory card, or a universal serial bus (USB) device (with a USB interface to the host), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface. The host interface 110 in the storage module 110 conveys memory management commands from the host controller 220 (FIG. 2A) or host 240 (FIG. 2B) to the controller 110, and also conveys memory responses from the controller 110 to the host controller 220 (FIG. 2A) or host 240 (FIG. 2B). Also, it should be noted that when the storage module 110 is embedded in the host 210, some or all of the functions described herein as being performed by the controller 110 in the storage module 100 can instead be performed by the host controller 220.

Returning to FIG. 1, the controller 110 comprises a central processing unit (CPU) 113, an optional hardware crypto-engine 114 operative to provide encryption and/or decryption operations, read access memory (RAM) 215, read only memory (ROM) 116 which can store firmware for the basic operations of the storage module 100, and a non-volatile memory (NVM) 117 which can store a device-specific key used for encryption/decryption operations, when used. The controller 110 can be implemented in any suitable manner. For example, the controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Suitable controllers can be obtained from Marvell or SandForce.

The non-volatile memory 120 can also take any suitable form. For example, in one embodiment, the non-volatile memory 120 takes the form of a solid-state (e.g., flash) memory and can be one-time programmable, few-time programmable, or many-time programmable. The non-volatile memory 120 can also use single-level cell (SLC), multiple-level cell (MLC), triple-level cell (TLC), or other memory technologies, now known or later developed.

With exemplary configurations of the storage module 100 now described, the following section discusses low-complexity methods for assessing the health of a flash memory device.

Embodiments Related to Low-Complexity Methods for Assessing the Health of a Flash Memory Device As mentioned above, these embodiments provide ways to estimate the health of a flash memory system. In general, in these embodiments, a relatively small number of error statistics are stored in the storage module's flash memory or controller, where the error statistics are derived from a large number of cells and are used to estimate the behavior of the entire device. Parameters of a Cell Error Rate (CER) are estimated by fitting the stored results with a parametric statistical model. The estimation may be done in the storage module itself or by communicating the stored results to the host or to any external computer. The diagnostics of the "health" of the system may be done by a software program in the storage module or in an external computer, which can make an automatic decision. Alternatively, the diagnostics can be done manually (e.g., by an engineer receiving the stored parameters from the flash). Another option a combination of machine and man, where a computer does a partial analysis, and an engineer takes the final decision based on the software results. It should also be noted that, in some embodiments, it may not be required to examine all the cells in the flash memory, and it is not required to store a large number of test results in the flash.

The estimated parameters are used for computing the "health" condition of the system. For example, if it is assumed that the full distribution follows a log-normal model (i.e. the log of the CER or the BER of an e-block is a normal random variable), then the full distribution may be determined by well-known methods using only the sum (mean) of the CER and the sum (mean) of the squares of the CER. A typical criterion for determining that a system is "healthy" is checking the system status against the requirement for having less than m failed ppm. This can be done, based on the aforementioned estimated distribution, by calculating CER_CORRSP_PPM, the number of erroneous cells per e-block that corresponds to m failed ppm, for a predefined m (i.e. this is the number n, such that the probability for a device having an e-block with number of erroneous cell>n, is m/1000000. The flash device may be considered "healthy" if CER_CORRSP_PPM is less than the correction capability of the flash, or in mathematical notation if:

CER_CORRSP_PPM<CER_ECC_Correction_Capability.

According to another embodiment, the statistical model is assumed to be within the bounds of a model chosen from a plurality of models. For example, it may be unknown whether the whole distribution follows a log-normal distribution or if just the tail of the distribution follows a log-normal distribution. In this case, both models may be estimated based on the observations, and a memory is considered qualified if it is qualified according to both models.

According to another embodiment, the estimation can be done using a small set of registers. The registers will store the CER (or bit error rate (BER)) only at a limited number of predefined error regions. For example, $n_1$ registers may be used for storing the $n_1$ maximum values of the CER values, and other $n_2$ registers may be used for estimation of the 70% order statistics.

An algorithm implemented in the storage module can determine the CER value at the predefined points. In the example given above, the values stored in the $n_1$ registers can be used to estimate the CER at $$\frac{N_1}{N_1+1},$$

where $N_1$ is the number of e-blocks tested to get the statistics, and the values stored in the $n_2$ registers can be used to estimate the CER at the 70% point.

Using this information, the whole distribution parameters can be computed (assuming the distribution follows a parametric model, which parameters can be estimated from the above measurements).

The $n_1$ registers may be computed using an algorithm such as:

Initialization:
First, insert the first n values that you read to a buffer M[1:n]
Iteration:
Read the next data item and store it in val (until you reach the end of the data).
If val>min (M[1:n]), delete min (M[1:n]) and save val in M[1:n].

This algorithm may read all the error values from all the e-blocks of the memory, but, due to the sorting algorithm, only the highest $n_1$ will be stored in the buffer. The minimum of this register can be returned to screen-out outliers.

A slightly more-complicated algorithm can be used for estimating the 70% order statistics using a window of $n_2$ registers.

Initialization:
Read the first $n_2$ entries of the data, and sort it in ascending order (save it in window).
Iteration:
Read the next data item (number of bit errors in an e-block) and store it in val (until you reach the end of the data).
Draw random variable 'direction' from Bernoulli distribution $$Ber\left(p = \frac{70}{100}\right):$$

```
if direction == 1
    window=pushAndSlideRight(window, val)
else
    window=pushAndSlideLeft(window, val)
end
```

Output $$window\left(\frac{n_2}{2}\right)$$

The routine pushAndSlideRight sorts $n_2+1$ numbers, $n_2$ from the window, and one from the val parameter, and deletes the minimal value (=effect of sliding to the right) remaining with a window of $n_2$ numbers.

The routine pushAndSlideLeft sorts $n_2+1$ numbers, $n_2$ from the window, and one from the val parameter, and deletes the maximal value (=effect of sliding to the left) remaining with a window of $n_2$ numbers.

The distribution may be estimated in two different ways, for example. According to one option, the full distribution is assumed to be a log-normal distribution, and, according to a second option, the distribution of the tail alone is assumed to be log normal, and this distribution will be estimated. Note that the tail distribution is typically used for the purpose of determining the health of a memory system.

In the first option (i.e. the full distribution is log-normal), we first estimate the expectation and variance of the (LN) distribution and then compute the parameters of the distribution ($\mu$, $\sigma$) using a well-known relation.

In more details, one may use the following computation:

Notation:

scalar $N_1$ that contains the number of e-blocks that this data describes.

scalar SZ_EBLOCK—a number that represents the number of bits on which the errors are counted (these are actually the number of user-data bits in each e-block). For example, in many systems an e-block size may be 4K, while in other systems, an e-block size may be 8K.

scalars $S_1$, $S_2$ that hold the sum of errors and sum of squares of error respectively.

BPC—The number of bits per cell.

Expectation unbiased estimator:

$$\hat{M} = \frac{BPC \cdot S_1}{N_1 \cdot SZ\_EBLOCK} \cdot 100$$

Variance unbiased estimator:

$$\hat{V} = BPC^2 \cdot 100^2 \left[ \frac{S_2}{(N_1 \cdot SZ\_EBLOCK - 1)} - \frac{(S_1)^2}{(N_1 \cdot SZ\_EBLOCK - 1) N_1 \cdot SZ\_EBLOCK} \right]$$

The estimators $\hat{\mu}, \hat{\sigma}^2$ of $\mu, \sigma^2$ may be extracted from $(\hat{M}, \hat{V})$ by:

$$\hat{\sigma}^2_{LN, full\ distribution} = \ln\left(\frac{\hat{V}}{\hat{M}^2} + 1\right)$$

$$\hat{\mu}_{LN, full\ distribution} = \ln\hat{M} - \frac{\hat{\sigma}^2}{2}$$

According to the second option (i.e., only the tail is log normal), it is assumed that there is a linear function expressing the log of the number of errors as a function of the distance from the mean of the distribution, where the distance is measured in units of sigma.

The computation of the distribution parameters according to this model may continue as follows.

STEP 1: Compute CER Values

As was mentioned before, we estimate two percentiles of CER (or BER) ($N_1/(N_1+1)$ and 70%) using two sets of registers. We denoted these two sets of registers by vmaxValues and v_70_percentage respectively. We next use them to estimate the high CER estimation and the 70% percentile estimation and store each result in CerValueForHighCntrs and CerValueFor70PerCntrs, respectively. Furthermore, let log CERValueForHighCounters and log CERValueFor70Precent be the natural logarithms of these values respectively.

STEP 2: Compute the Sigma Values that Correspond to the Two CER-Values.

$$sigmaForHighCounters == \phi^{-1}\left(\frac{N_1}{N_1+1}\right) = Q^{-1}\left(1 - \frac{N_1}{N_1+1}\right)$$

$$sigmaFor70Percent = \phi^{-1}(0.7) = Q^{-1}(1-0.7)$$

here: $\phi(x) = \frac{1}{\sqrt{2\pi}} \int_{-\infty}^{x} e^{-\frac{\alpha^2}{2}} d\alpha, \quad Q(x) = \frac{1}{\sqrt{2\pi}} \int_{x}^{\infty} e^{-\frac{\alpha^2}{2}} d\alpha.$ STEP 3: Find the Linear Function Parameters.

Find the parameters of the linear function sigma=a_LN× log(CER)+b_LN that connects the two points: (log CERValueFor70Precent,sigmaFor70Percent) and (log CER-ValueForHighCounters, sigmaForHighCounters):

$$a_{LN}^{(tail)} = \frac{sigmaForHighCounters - sigmaFor70Percent}{logCERValueForHighCounters - logCERValueFor70Precent};$$

$$b_{LN}^{(tail)} = sigmaFor70Percent - a_{LN}^{(tail)} \times logCERValueFor70Precent,$$

STEP 4: Estimate the (μ,σ) Parameters of the Tail of Distribution.

The tail of the distribution is assumed to be LN. We estimate its parameters accordingly:

$$\hat{\mu}_{LN,tail} = \frac{-b_{LN}^{(tail)}}{a_{LN}^{(tail)}}$$

$$\hat{\sigma}_{LN,tail} = \frac{1}{a_{LN}^{(tail)}}$$

The last step is to decide whether the system is qualified or not. This can be done by requiring that the system qualifies only if it is qualified under both models, and it is disqualified if it is disqualified according to any one of the models.

It should be noted, that the 70% percentile point and the high CER points are just an example, and other options for points may be considered. Furthermore, it might be beneficial to use more than two points to fit the linear function (least square fitting), however this may have a complexity toll. The assumption on the log-normal distribution is also just an example, and in case a different model is assumed, the algorithm may be generalized.

There are several advantages associated with these embodiments. First, unlike prior methods for evaluating system "health," which involve storing large amounts of data, these embodiments monitor only a small number of parameters from which the "health" of the memory can be decided. So, unlike the prior methods where the health analysis was limited to production and testing times, these embodiments can be used to perform the health analysis during normal operation of the memory system. That is, with these embodiments, the minimal set of parameters can be stored in the memory system during testing or during normal operating modes. The parameters can be processed inside the storage module using the capabilities of the logic in the storage module, and stored in the memory. Since the amount of data to be stored is minimal, the memory can continue normal operation. The parameters can be sent to the memory controller or to an external host for further analysis (automatic or manual) according to its schedule and priorities, and, in the meanwhile, the storage module can continue operation.

ADDITIONAL EXAMPLES

The following paragraphs provide some additional examples. In general, the goal of these examples is to assess the health of a memory die by collecting and outputting a limited size of measurements based on assumptions on the distribution of CER/BER of e-blocks, and estimating parameters of the distribution. In one example shown below, the estimation of parameters of a tail of a distribution (assuming log normal) can be done by line fitting, and extrapolation. Statistics may be collected over a multiple number of e-blocks, and for a multiple number of CER/BER values the tail probability will be estimated. For example the number of errors may be measured for 100K e-blocks, and the tail probabilities can be estimated. To be more specific consider the case where according to the gathered statistics:

$Pr(BER>9.1\times10^{-4})=0.50$ $Pr(BER>11.9\times10^{-4})=0.16$ $Pr(BER>14.3\times10^{-4})=0.02$ The gathered statistics may be used to generate points on a sigma plot, where the x-axis is the log of the BER, and the y-axis is the argument of the Q-function which corresponds to the same probability. In statistics the Q-function is the probability of the tail of the standard normal distribution. In other words, Q(x) is the probability that a normal (Gaussian) random variable will obtain a value larger than x standard deviations above the mean.

In mathematical language $$Q(x) = \frac{1}{\sqrt{2\pi}} \int_{x}^{\infty} e^{-\frac{t^2}{2}} dt$$

In the specific example introduced above, the BER of 9.1× $10^{-4}$ will be associated with 0, since Q(0)=0.5; 11.9×$10^{-4}$ will be associated with 1, and 14.3×$10^{-4}$ will be associated with 2. In order to determine the health of the memory there is a need to estimate the sigma plot at much higher values, such as where at the point where sigma=6. To determine the tail probability of the BER at such a high point would require sampling over billions of e-blocks, (since Q(6)<1e-9). According to the present invention, instead of sampling over such a large sample set, the sigma plot at the required point may be estimated by curve fitting to the points measured on the sigma plot and extrapolation to the desired point. If it is assumed that the BER distribution follows a normal distribution or a log-normal distribution, then the curve fitting may be determined by the sigma-plot at least two points and fitting a straight line. Note that the data for this example is taken from the lower line in FIG. 4.

As noted above, the goal of one embodiment is to assess the health of a memory die by collecting and outputting a limited size of measurements, such as, for example, an estimation of a sigma plot and an estimation of a failure probability of a memory die. These measurements can be compared to standard criteria of health, such as, for example, qualification measurements for a current lifetime point and a minimum allowed failure rate requirements. From this, it can be decided if the die is healthy or not. (In a multi-die system, this may result in limiting the work load on a die or disabling it altogether. In a RAID system, an appropriate notification to the a management layer, may result in replacing the problematic disk before a catastrophic event occurs)

Figure 3:
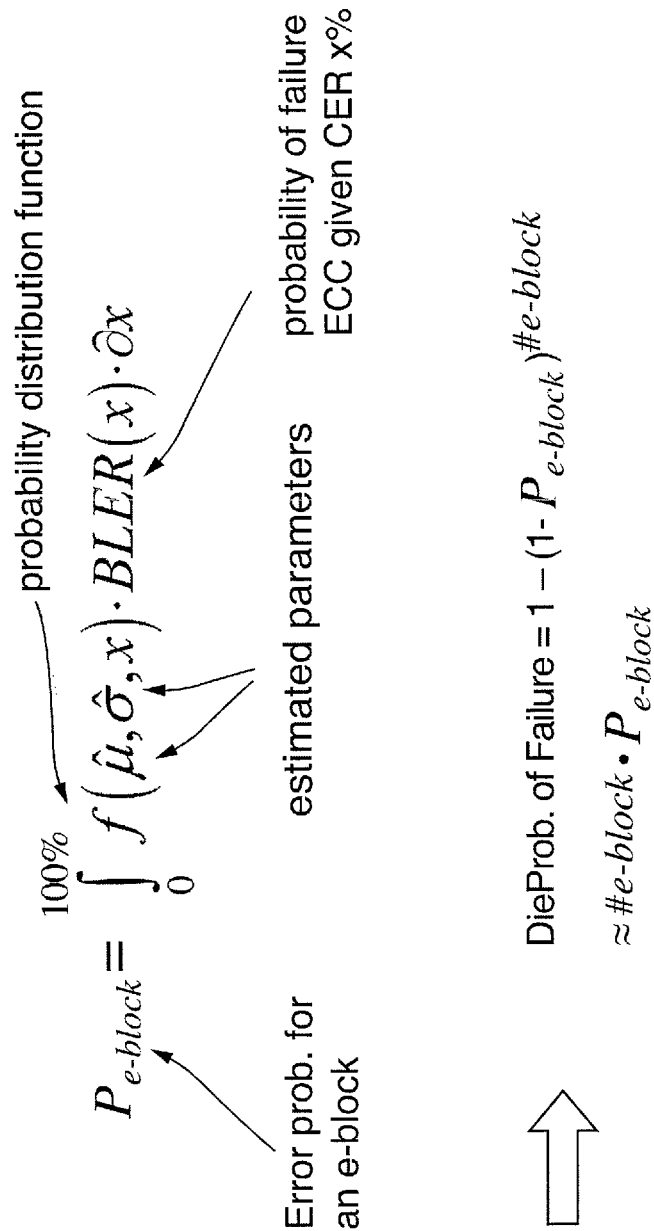
FIG. 3 is a depiction of a formula for predicting the probably of memory die failure of an embodiment.

The feasibility of this approach is based on the assumption that the error rate of the e-blocks is distributed according to a pre-determined distribution family (e.g., normal, log-normal, etc.) The idea is to estimate the parameters of the distribution and thereby assess the probability of failure, as shown in the formula depicted in FIG. 3.

Figure 4:
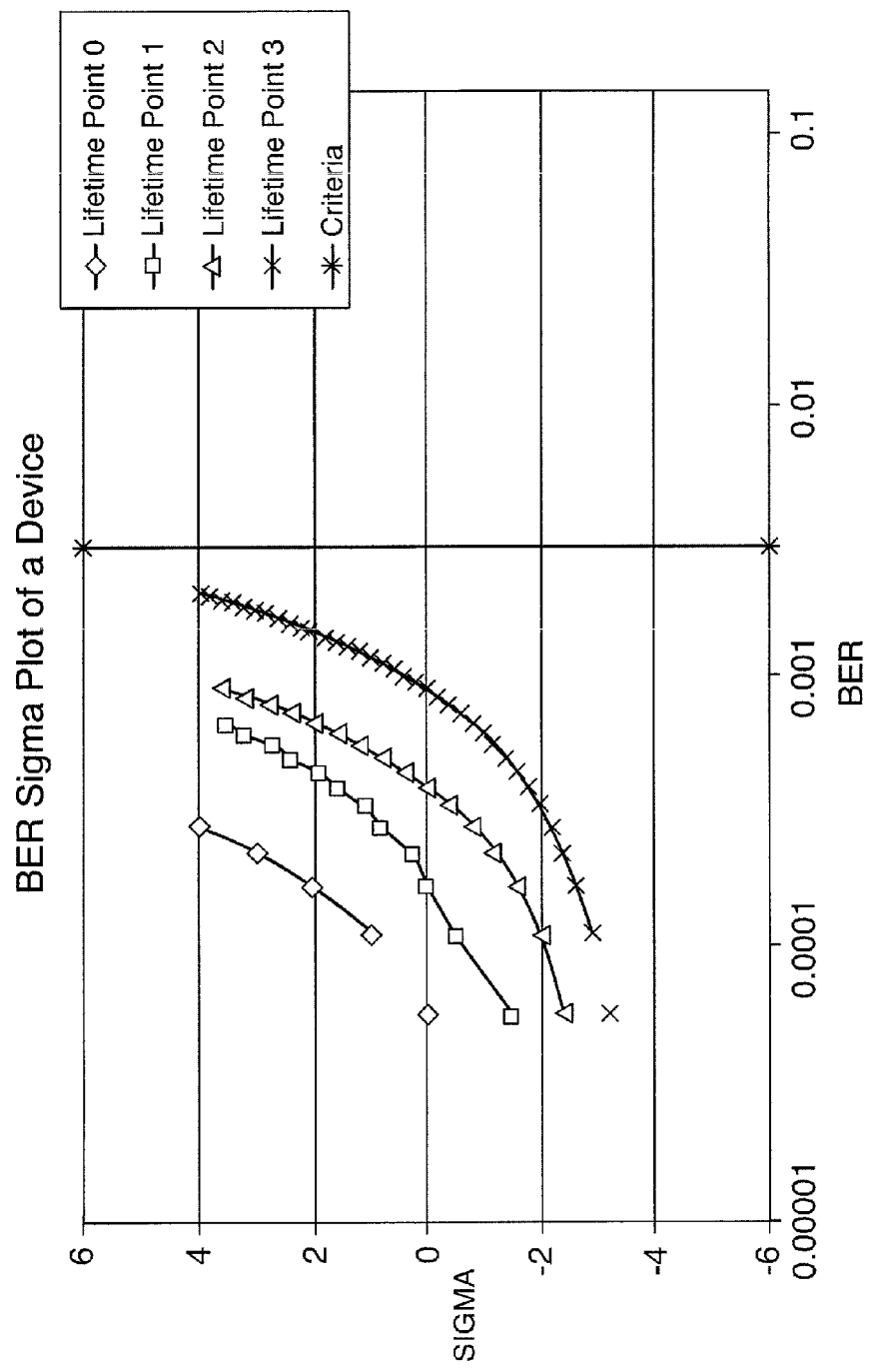
FIG. 4 is an illustration of a BER sigma plot of a device of an embodiment.
Figure 5:
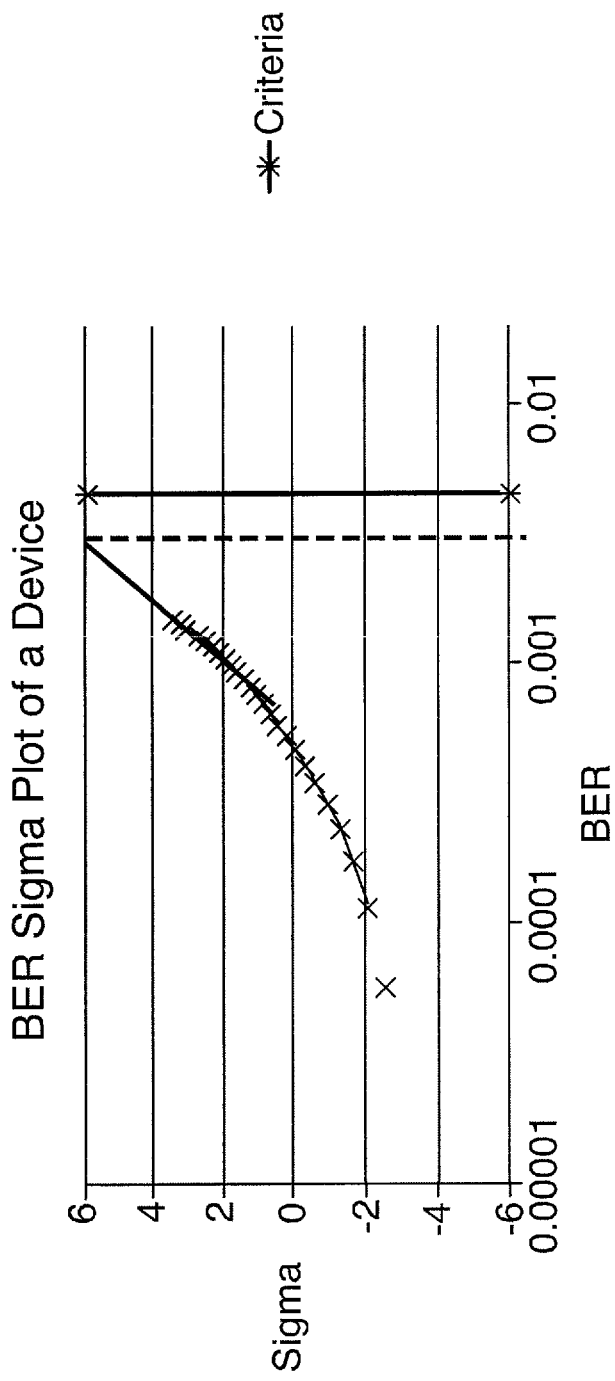
FIG. 5 is an illustration of a CER/BER tail distribution estimation of an embodiment.

FIGS. 4 and 5 are illustrations of a CER/BER tail distribution estimation of an embodiment. Here, the assumption is that the CER and BER are log-normal distributed on their tail. By preparing a sigma plot, we can assess the healthiness of the device. The idea is to fit a straight line to the tail of the sigma plot thereby estimating its parameters. Assume we measured the BER of N e-blocks and prepared a sigma plot and fitted a straight line that passes through its tail. A suggested health meter can be the BER value corresponding to the 6 sigma point (the smaller the healthier). An alternative health meter can be the sigma value corresponding to a certain criterion BER or CER (the larger the healthier).

Figure 6:
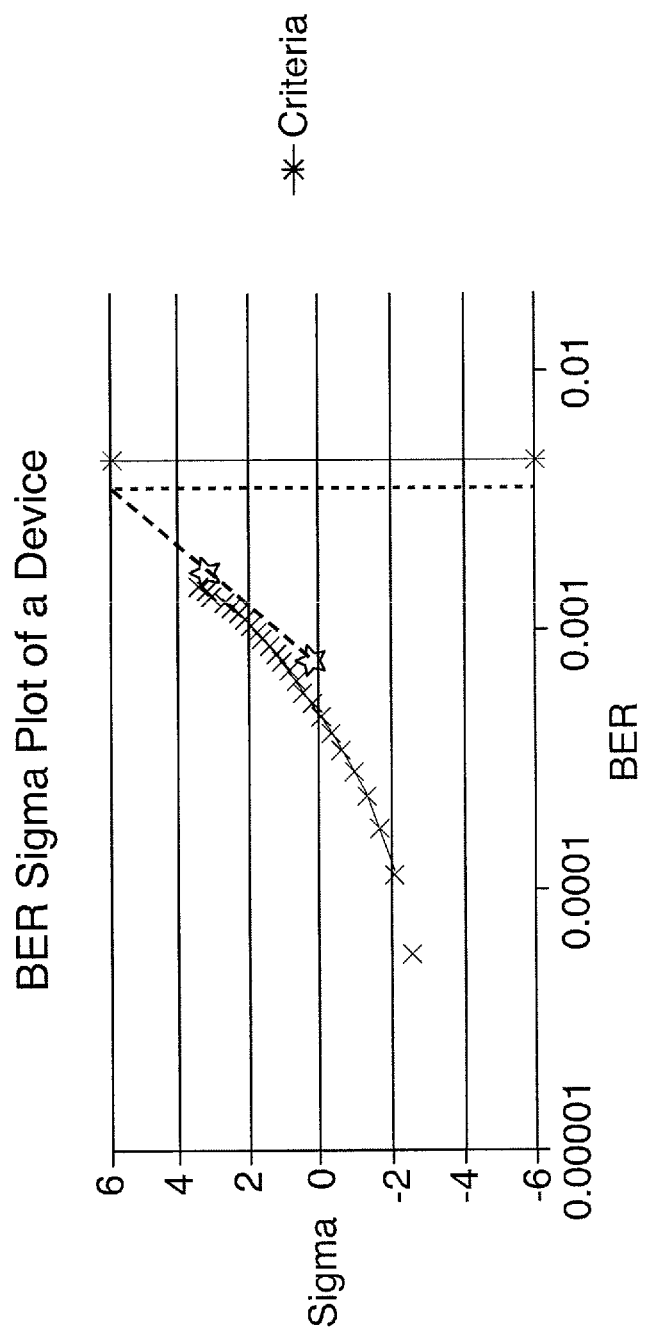
FIG. 6 is an illustration of further approximations to the CER/BER tail distribution estimation of an embodiment.

FIG. 6 is a diagram illustrating further approximations to the CER/BER tail distribution estimation. Sometimes, the generation of the sigma plot and the straight line fitting may be too demanding for the storage module's controller/processor. To account for this, a few points on the curve can be estimated to find the parameters of the line according to these estimations.

To estimate the parameters of the log-normal distribution, the system can estimate the 70% percentile ($CER_{0.7}$). The maximum point from the sample space ($CER_{max}$) can also be estimated. The system then counts the number of e-blocks that were measured (N) and uses the two estimations to calculate the parameters of the line that passes between (log(($CER_{0.7}$), $Q^{-1}(1-0.7)$, (log($CER_{max}$), $Q^{-1}(1/(N+1))$). The 6*sigma point of the CER of this distribution can be estimated, as well as the $\mu$, $\sigma$ and the fail rate. The line parameters can then be compared with standard criteria.

Figure 7:
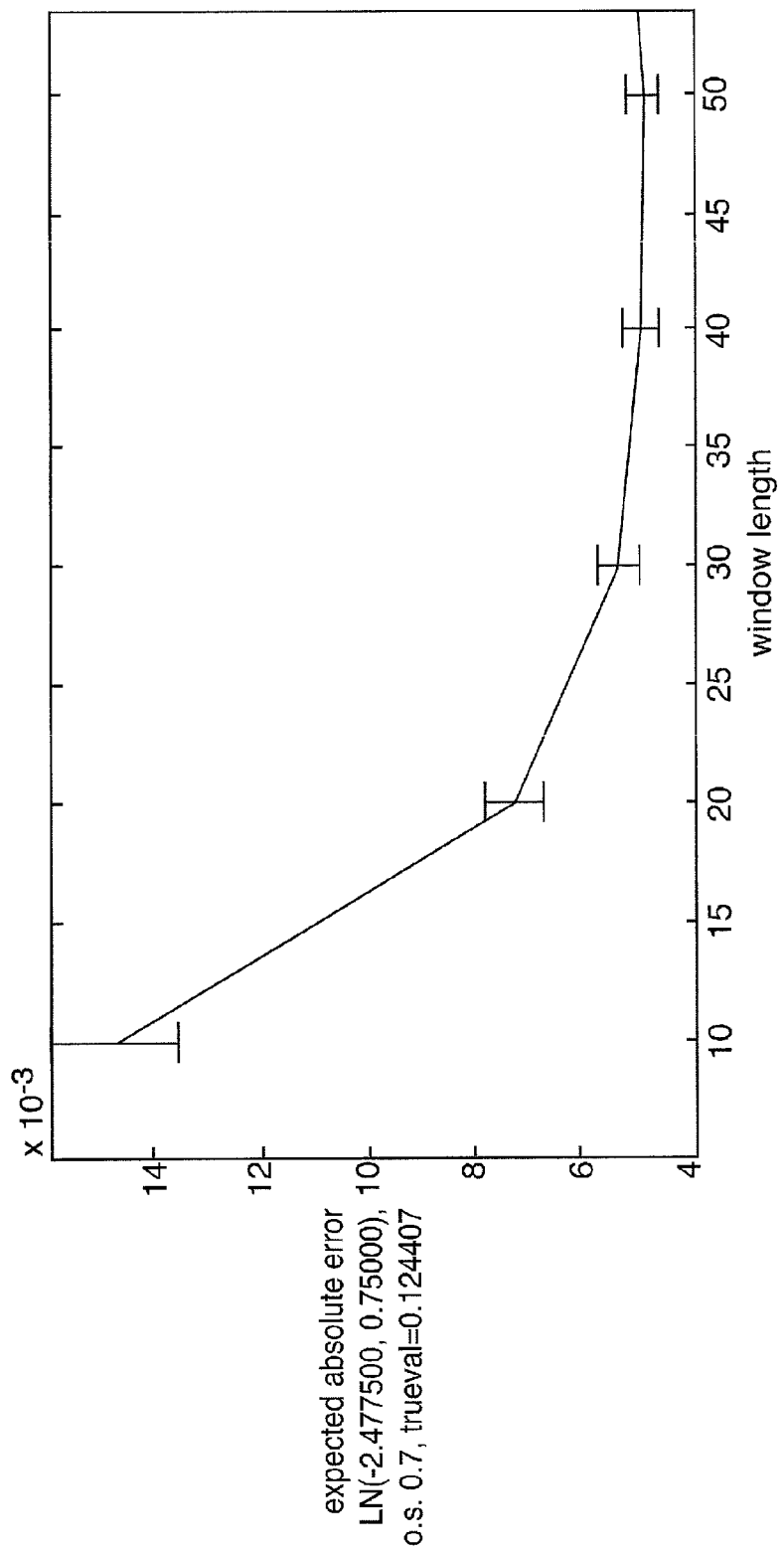
FIG. 7 is a graph of preliminary results of the 70% percentile estimator.

For an estimation of the 70% percentile, a register window of size $n_2$ of CER/BER values can be used. As long as the window is not full, new values can be inserted and stored in ascending order. When the window is full, the new value is inserted to the window, and then the window is moved with probability 0.7 to the right (towards the high CER/BER values), and 0.3 to the left. The middle of the window is returned. FIG. 7 is a graph of preliminary results of the 70% percentile estimator, where there are 1,000 CER values per window, and where the bars indicate a 3 standard deviations interval around the expectation.

To make an estimation of the maximum point, the system uses a register window of size $n_2$ holding the maximum values of CERs (or BERs) collected so far (the window is used to protect against outliers). For each CER value, if the CER value is larger than the minimum value in the window, the system inserts the CER value to the window. The minimum of the window is then returned.

CONCLUSION

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for assessing health of a memory in a storage module, wherein the memory stores data encoded by an Error Correcting Code (ECC), the method comprising:
   determining cell error rate statistics for a subset of memory cells; and
   determining an error probability for the entire memory from the cell error rate statistics for the subset of memory cells by:
      estimating cell error rate parameters of a probability distribution function by fitting the determined cell error rate statistics for the subset of memory cells with a parametric statistical model of errors across the entire memory; and
      determining an output of the probability distribution function using the estimated cell error rate parameters as an input.

2. The method of claim 1 further comprising:
   estimating a health condition of the memory based on the determined error probability; and
   transmitting the health condition to an outside entity.

3. The method of claim 1, wherein the memory is considered healthy if a probability that the number of errors in a codeword would exceed an error correction capability of the ECC is less than a predefined number.

4. The method of claim 1, wherein the parametric statistical model is within bounds of a model chosen from a plurality of parametric statistical models.

5. The method of claim 1, wherein the estimating is done using registers in the memory module to store the cell error rate for predefined error regions.

6. The method of claim 1, wherein a full distribution of errors is assumed to be a log-normal distribution.

7. The method of claim 1, wherein a distribution of a tail portion of a full distribution of errors is assumed to be a log-normal distribution, and wherein the tail portion is used to estimate the parameters.

8. The method of claim 1, wherein the determining and estimating are done by a processor in the storage module.

9. A storage module configured to removably connect with a host, the storage module comprising:
   a memory; and
   a processor in communication with the memory, wherein the processor is configured to:
      write data to a subset of memory cells in a memory of a storage module;
      determine cell error rate statistics for the subset of memory cells; and
      determine an error probability for the entire memory from the cell error rate statistics for the subset of memory cells by:
         estimating cell error rate parameters of a probability distribution function by fitting the determined cell error rate statistics for the subset of memory cells with a parametric statistical model of errors across the entire memory; and
         determining an output of the probability distribution function using the estimated cell error rate parameters as an input.

10. The storage module of claim 9, wherein the processor is further configured to:
    estimate a health condition of the memory based on the determined error probability; and
    transmit the health condition to an outside entity.

11. The storage module of claim 9, wherein the memory is considered healthy a probability that the number of errors in a codeword would exceed an error correction capability of the ECC is less than a predefined number.

12. The storage module of claim 9, wherein the parametric statistical model is within bounds of a model chosen from a plurality of parametric statistical models.

13. The storage module of claim 9, wherein the estimating is done using registers in the memory module to store the cell error rate for predefined error regions.

14. The storage module of claim 9, wherein a full distribution of errors is assumed to be a log-normal distribution.

15. The storage module of claim 9, wherein a distribution of a tail portion of a full distribution of errors is assumed to be a log-normal distribution, and wherein the tail portion is used to estimate the parameters.

* * * * *